(12) United States Patent
Löbl et al.

(10) Patent No.: US 6,503,609 B1
(45) Date of Patent: Jan. 7, 2003

(54) PASSIVE CERAMIC COMPONENT

(75) Inventors: Hans-Peter Löbl, Monschau (DE); Detlef Raasch, Aachen (DE); Horst Bentin, Aachen (DE); Gerd Much, Herzogenrath (DE); Peter Klaus Bachmann, Würselen (DE); Mareike Klee, Hückelhoven (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/487,148

(22) Filed: Jan. 19, 2000

(30) Foreign Application Priority Data

Jan. 25, 1999 (DE) .......................... 199 02 769

(51) Int. Cl.[7] .......................... H01G 4/30; H01G 4/00; B32B 9/00
(52) U.S. Cl. .................. 428/209; 428/428; 428/432; 428/433; 428/434; 428/450; 428/458; 428/469; 428/697; 428/699; 428/701; 428/702; 428/698; 361/301.4; 361/311; 361/321.1; 361/321.5
(58) Field of Search ................. 428/450, 428, 428/432, 433, 434, 458, 469, 697, 699, 701, 702, 698; 361/301.4, 311, 321.1, 321.2, 321.5

(56) References Cited

U.S. PATENT DOCUMENTS

| | | | | |
|---|---|---|---|---|
| 3,596,370 A | * | 8/1971 | Gabrail | 317/320 |
| 5,330,931 A | * | 7/1994 | Emesh et al. | 437/60 |
| 5,335,138 A | * | 8/1994 | Sandhu et al. | 361/303 |
| 5,909,042 A | * | 6/1999 | Azuma et al. | 257/295 |
| 6,125,026 A | * | 9/2000 | Desamber et al. | 361/301.4 |
| 6,207,522 B1 | * | 3/2001 | Hunt et al. | 438/393 |
| 6,218,233 B1 | * | 4/2001 | Takemura | 438/240 |
| 6,225,133 B1 | * | 5/2001 | Yamamichi et al. | 438/3 |
| 6,262,849 B1 | * | 7/2001 | Lee | 438/3 |
| 6,339,527 B1 | * | 1/2002 | Farooq et al. | 361/305 |

FOREIGN PATENT DOCUMENTS

| | | | |
|---|---|---|---|
| JP | 40602865 A | * | 1/1994 |
| JP | 409252094 A | * | 9/1997 |

* cited by examiner

Primary Examiner—Deborah Jones
Assistant Examiner—Stephen Stein
(74) Attorney, Agent, or Firm—Ernestine C. Bartlett

(57) ABSTRACT

The invention relates to a passive ceramic component with a carrier substrate, at least one first electrode, at least one first barrier layer, at least one dielectric, and at least one second electrode. A metal, an alloy, or a conductive oxide is used for the barrier layer.

8 Claims, 1 Drawing Sheet

PASSIVE CERAMIC COMPONENT

BACKGROUND OF THE INVENTION

The invention relates to a pasive ceramic component with a carrier substrate, at least one first electrode, at least a first barrier layer, at least one dielectric, and at least one second electrode.

Thin film capacitors usually comprise a carrier substrate, a dielectric, and two electrodes. Silicon provided with a passivating layer, a ceramic material, a glass-ceramic material, or a glass material may be used for the carrier substrate. The electrodes of a thin film capacitor may be made from a noble metal or a non-noble metal. Only well-insulating materials such as, for example, ceramic materials or insulating layers provided by a thin film technique are suitable for the dielectric.

The components are subjected to temperatures of 200 to 600° C. in the manufacture of thin film capacitors. These high temperatures are necessary for ensuring a sufficient adhesion of the individual layers of the thin film capacitors to one another, and in particular of the lower layer to the carrier substrate or the passivating layer, if present. These temperatures are necessary furthermore for improving the electrical quality of the dielectric.

Different coefficients of thermal expansion of the individual layers may cause cracks in the dielectric at these high temperatures. Metal atoms of the electrodes may diffuse into these hollow cracks and in an extreme case cause a short-circuit between the two electrodes of the thin film capacitor. Without the formation of cracks, however, it is also possible for metal atoms of the electrodes to diffuse into the dielectric and cause short-circuits there, given the elevated manufacturing temperatures.

To counteract this problem, a so-called barrier layer may be provided between the dielectric and an electrode. A thin film capacitor is known from U.S. Pat. No. 3,596,370, wherein a barrier layer of aluminum oxide or aluminum chromate is applied between the lower electrode and the dielectric.

A disadvantage of the described thin film capacitor is that on the one hand aluminum chromate is toxic and on the other hand aluminum oxide is a material with a considerable surface roughness, which may enter into undesirable reactions with the dielectric. In addition, aluminum oxide is itself a dielectric with an $\in_r$ value, so that a stack of dielectrics is present in this thin film capacitor which can influence the characteristics of the thin film capacitor.

SUMMARY OF THE INVENTION

The invention has for its object to provide an improved thin film capacitor.

This object is achieved by means of a passive ceramic component with a carrier substrate, at least one first electrode, at least a first barrier layer, at least one dielectric, and at least one second electrode, in that the barrier layer comprises:

$Ti_xW_y$ ($0 \leq x \leq 1$, $0 \leq y \leq 1$),
Cr,
$Cr_xO_y$ ($0 \leq x \leq 1$, $0 \leq y \leq 1$),
Nb,
Ta,
Ti,
W,
$Ni_xMo_y$ ($0 \leq x \leq 1$, $0 \leq y \leq 1$),
$Ir_xTa_y$ ($0 \leq x \leq 1$, $0 \leq y \leq 1$),
$Ir_xZr_y$ ($0 \leq x \leq 1$, $0 \leq y \leq 1$),
$Fe_xW_y$ ($0 \leq x \leq 1$, $0 \leq y \leq 1$),
$Ni_xNb_y$ ($0 \leq x \leq 1$, $0 \leq y \leq 1$),
$W_xSi_y$ ($0 \leq x \leq 1$, $0 \leq y \leq 1$),
$Pt_xSi_y$ ($0 \leq x \leq 1$, $0 \leq y \leq 1$),
$Ta_xSi_yN_z$ ($0 \leq x \leq 1$, $0 \leq y \leq 1$, $0 \leq z \leq 1$),
$Ti_xSi_yN_z$ ($0 \leq x \leq 1$, $0 \leq y \leq 1$, $0 \leq z \leq 1$),
$Mo_xSi_yN_z$ ($0 \leq x \leq 1$, $0 \leq y \leq 1$, $0 \leq z \leq 1$),
$Co_xSi_y$ ($0 \leq x \leq 1$, $0 \leq y \leq 1$),
$Cr_xSi_y$ ($0 \leq x \leq 1$, $0 \leq y \leq 1$),
$Cr_xSi_yN_z$ ($0 \leq x \leq 1$, $0 \leq y \leq 1$),
$Cr_xSi_yO_z$ ($0 \leq x \leq 1$, $0 \leq y \leq 1$, $0 \leq z \leq 1$),
$Ti_xN_y$ ($0 \leq x \leq 1$, $0 \leq y \leq 1$),
$W_xN_y$ ($0 \leq x \leq 1$, $0 \leq y \leq 1$),
$Ti_xW_yN_z$ ($0 \leq x \leq 1$, $0 \leq y \leq 1$, $0 \leq z \leq 1$),
$Hf_xN_y$ ($0 \leq x \leq 1$, $0 \leq y \leq 1$),
$Ta_xN_y$ ($0 \leq x \leq 1$, $0 \leq y \leq 1$),
$Ru_xO_y$ ($0 \leq x \leq 1$, $0 \leq y \leq 1$),
$Mo_xO_y$ ($0 \leq x \leq 1$, $0 \leq y \leq 1$),
$Ir_xO_y$ ($0 \leq x \leq 1$, $0 \leq y \leq 1$) or
$Ni_xCr_yAl_z$ ($0 \leq x \leq 1$, $0 \leq y \leq 1$, $0 \leq z \leq 1$), or combinations of these materials.

This thin film capacitor has the advantage that the barrier layer comprises a material without interfering dielectric properties.

In a preferred embodiment, a further barrier layer is present between the dielectric and the second electrode, which further barrier layer comprises:

$Ti_xW_y$ ($0 \leq x \leq 1$, $0 \leq y \leq 1$),
Cr,
$Cr_xO_y$ ($0 \leq x \leq 1$, $0 \leq y \leq 1$),
Nb,
Ta,
Ti,
W,
$Ni_xNb_y$ ($0 \leq x \leq 1$, $0 \leq y \leq 1$),
$Ni_xMo_y$ ($0 \leq x \leq 1$, $0 \leq y \leq 1$),
$Ir_xTa_y$ ($0 \leq x \leq 1$, $0 \leq y \leq 1$),
$Ir_xZr_y$ ($0 \leq x \leq 1$, $0 \leq y \leq 1$),
$Fe_xW_y$ ($0 \leq x \leq 1$, $0 \leq y \leq 1$),
$W_xSi_y$ ($0 \leq x \leq 1$, $0 \leq y \leq 1$),
$Pt_xSi_y$ ($0 \leq x \leq 1$, $0 \leq y \leq 1$),
$Ta_xSi_yN_z$ ($0 \leq x \leq 1$, $0 \leq y \leq 1$, $0 \leq z \leq 1$),
$Ti_xSi_yN_z$ ($0 \leq x \leq 1$, $0 \leq y \leq 1$, $0 \leq z \leq 1$),
$Mo_xSi_yN_z$ ($0 \leq x \leq 1$, $0 \leq y \leq 1$, $0 \leq z \leq 1$),
$Co_xSi_y$ ($0 \leq x \leq 1$, $0 \leq y \leq 1$),
$Cr_xSi_y$ ($0 \leq x \leq 1$, $0 \leq y \leq 1$),
$Cr_xSi_yN_z$ ($0 \leq x \leq 1$, $0 \leq y \leq 1$),
$Cr_xSi_yO_z$ ($0 \leq x \leq 1$, $0 \leq y \leq 1$, $0 \leq z \leq 1$),
$Ti_xN_y$ ($0 \leq x \leq 1$, $0 \leq y \leq 1$),
$W_xN_y$ ($0 \leq x \leq 1$, $0 \leq y \leq 1$),
$Ti_xW_yN_z$ ($0 \leq x \leq 1$, $0 \leq y \leq 1$, $0 \leq z \leq 1$),
$Hf_xN_y$ ($0 \leq x \leq 1$, $0 \leq y \leq 1$),
$Ta_xN_y$ ($0 \leq x \leq 1$, $0 \leq y \leq 1$),
$Ru_xO_y$ ($0 \leq x \leq 1$, $0 \leq y \leq 1$), $Mo_xO_y$ ($0 \leq x \leq 1$, $0 \leq y \leq 1$), $Ir_xO_y$ ($0 \leq x \leq 1$, $0 \leq y \leq 1$), $Ni_xCr_yAl_z$ ($0 \leq x \leq 1$, $0 \leq y \leq 1$, $0 \leq z \leq 1$), or combinations of these materials. This barrier layer prevents undesirable reactions between the dielectric and the second electrode. In addition, the above materials have no dielectric properties which interfere with the characteristics of the thin film capacitor.

It may furthermore be preferred that an adhesion layer of Ti, Cr, $Ni_xCr_y$ ($0 \leq x \leq 1$, $0 \leq y \leq 1$) or $Ti_xW_y$ ($0 \leq x \leq 1$, $0 \leq y \leq 1$) is provided between the carrier substrate and the first electrode. This adhesion layer improves the adhesion between the carrier substrate and the first electrode.

It is also advantageous when at least a first and a second current supply contact are provided at mutually opposed sides of the component. Each thin film capacitor can be electrically connected to further components of a circuit by means of said current supply contacts. Depending on the type of application or mounting method, an electroplated SMD end contact, a bump end contact, or a via may be used for this. The use of SMD end contacts or bump end contacts renders possible the manufacture of discrete thin film capacitors, while the use of vias enables a direct integration of the component in ICs.

Preferably, a ceramic material, a glass-ceramic material, a glass material, or silicon is used for the carrier substrate. A carrier substrate of a ceramic or glass-ceramic material or a glass substrate can be inexpensively manufactured, so that the process cost for the relevant components can be kept low. The carrier substrate will be made of silicon if multiple-component units are to be incorporated in ICs.

Preferably, the dielectric comprises $Si_3N_4$, $Ta_2O_5$, $SiO_2$, $Si_xN_yO_z$ ($0 \leq x \leq 1$, $0 \leq y \leq 1$, $0 \leq z \leq 1$), $SiO_2/Si_3N_4/SiO_2$, $Ba_{1-x}Sr_xTiO_3$ ($0 \leq x \leq 1$)

$SrTi_{1-x}Zr_xO_3$ ($0 \leq x \leq 1$) with and without Mn as a dopant, $BaO$—$Ln_2O_3$—$TiO_2$ (Ln=La. Ce, Nd, Sm or Eu), $Al_2O_3$, $Ba_2Ti_9O_{20}$, $Ba_2Ti_{9-x}Zr_xO_{20}$ ($0 \leq x \leq 1$) with and without Mn as a dopant, $BaTi_5O_{11}$, $BaTi_4O_9$, $Nb_2O_5$, $TiO_2$, $(Ta_2O_5)_x$—$(Al_2O_3)_{1-x}$ ($0 \leq x \leq 1$), $(Ta_2O_5)_x$—$(TiO_2)_{1-x}$ ($0 \leq x \leq 1$), $(Ta_2O_5)_x$—$(Nb_2O_5)_{1-x}$ ($0 \leq x \leq 1$), $(Ta_2O_5)_x$—$(SiO_2)_{1-x}$ ($0 \leq x \leq 1$), $(Sr,Ca)(Ti,Zr)O_3$, $BaO$—$SrO$—$CaO$—$Nd_2O_3$—$Gd_2O_3$—$Nb_2O_3$—$TiO_2$, $CaSm_2Ti_5O_{14}$, $Zr(Ti,Sn)O_4$, $BaO$—$PbO$—$Nd_2O_3$—$Pr_2O_3$—$Bi_2O_3$—$TiO_2$, $Ba(Zr,Zn,Ta)O_3$, $CaTiO_3$—$LaAlO_3$, $(Bi_3(Ni_2Nb)O_9)_{1-x}$ ($0 \leq x \leq 1$), $(Bi_2(ZnNb_{2(1+d)y}O_{3+6y+5yd})_x$, ($0 \leq x \leq 1$, $0.5 \leq y \leq 1.5$, $-0.05 \leq d \leq 0.05$)

$Pb(Zr_xTi_{1-x})O_3$ ($0 \leq x \leq 1$) with and without excess lead, $Pb_{1-\alpha y}La_y(Zr_xTi_{1-x})O_3$ ($0 \leq x \leq 1$, $0 \leq y \leq 0.2$, $1.3 \leq \alpha \leq 1.5$), $Pb_{1-\alpha y}La_yTiO_3$ ($0 \leq y \leq 0.3$, $1.3 \leq \alpha \leq 1.5$), $(Pb,Ca)TiO_3$, $BaTiO_3$ with and without dopants, $BaZr_xTi_{1-x}O_3$ ($0 \leq x \leq 1$), $Ba_{1-y}Sr_yZr_xTi_{1-x}O_3$ ($0 \leq x \leq 1$, $0 \leq y \leq 1$), $Ba(Zn,Ta)O_3$, $BaZrO_3$, $PbNb_x((Zr_{0.6}Sn_{0.4})_{1-y}Ti_y))_{1-x}O_3$ ($0 \leq x \leq 0.9$, $0 \leq y \leq 1$), $Pb(Mg_{1/3}Nb_{2/3})O_3]_x$—$[PbTiO_3]_{1-x}$ ($0 \leq x \leq 1$) or $(Pb,Ba,Sr)(Mg_{1/3}Nb_{2/3})_xTi_y(Zn_{1/3}Nb_{2/3})_{1-x-y}O_3$, ($0 \leq x \leq 1$, $0 \leq y \leq 1$, $x+y \leq 1$) or a) $Pb(Mg_{1/2}W_{1/2})O_3$, b) $Pb(Fe_{1/2}Nb_{1/2})O_3$, c) $Pb(Fe_{2/3}W_{1/3})O_3$, d) $Pb(Ni_{1/3}Nb_{2/3})O_3$, e) $Pb(Zn_{1/3}Nb_{2/3})O_3$ or f) $Pb(Sc_{1/2}Ta_{1/2})O_3$ as well as combinations of the compounds a) to f) with $PbTiO_3$ and $Pb(Mg_{1/3}Nb_{2/3})O_3$ with or without excess lead.

It is furthermore preferred that the electrodes comprise Al, Al doped with Cu, Al doped with Si, Al doped with Mg, or Ag, Cu, Ni, Au, W, or combinations of these metals. The layers are structured, for example, by means of lithographical processes in combination with wet and dry etching steps.

It may also be preferred that a protective layer of an organic and/or inorganic polymer is provided on the second electrode. This protective layer protects the subjacent electrodes and the dielectric against, for example, mechanical loads and corrosion.

DETAILED DESCRIPTION OF THE INVENTION

Figure 1:
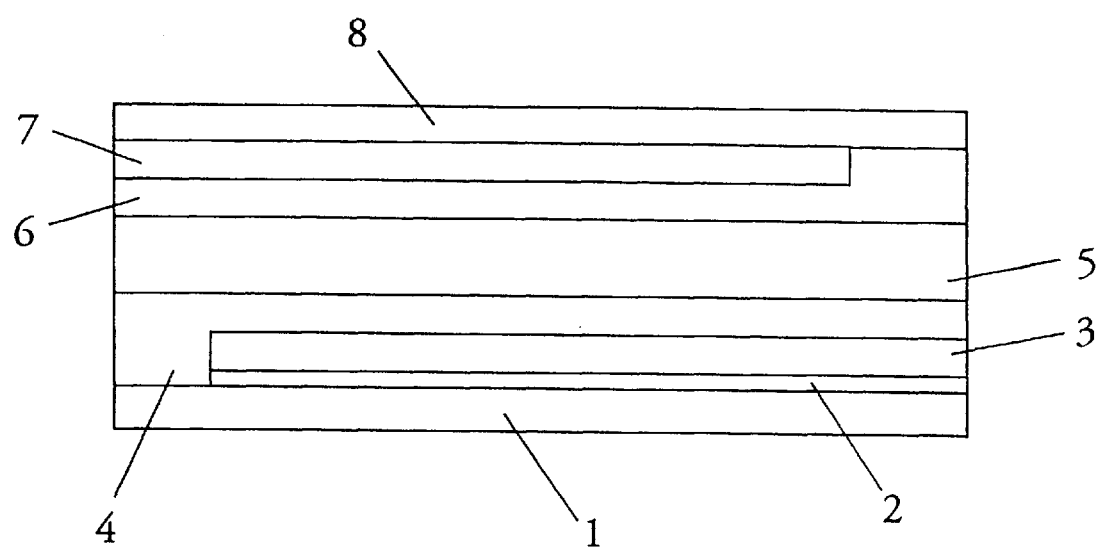
FIG. 1 diagrammatically depicts the construction of a thin film capacitor according to the invention.

The invention will not be described in greater detail with reference to the figure of the drawing and the embodiments that follow.

In FIG. 1, a thin film capacitor comprises a carrier substrate $_1$ which is made, for example, from a ceramic material, a glass-ceramic material, a glass material, or silicon. An adhesion layer 2 comprising, for example, Ti, Cr, $Ni_xCr_y$ ($0 \leq x \leq 1$, $0 \leq y \leq 1$) or $Ti_xW_y$ ($0 \leq x \leq 1$, $0 \leq y \leq 1$) is present on the carrier substrate 1, and a first electrode 3 is provided on the adhesion layer 2. The first electrode 3 comprises, for example, Al, Al doped with Cu, Al doped with Si, Al doped with Mg or Ag, Cu, Ni, Au, W, or combinations of these metals. On this first electrode 3 there is a barrier layer 4 which comprises, for example, $Ti_xW_y$ ($0 \leq x \leq 1$, $0 \leq y \leq 1$), Cr, $Cr_xO_y$ ($0 \leq x \leq 1$, $0 \leq y \leq 1$), Nb, Ta, Ti,

W, $Ni_xNb_y$ ($0 \leq x \leq 1$, $0 \leq y \leq 1$), $Ni_xMo_y$ ($0 \leq x \leq 1$, $0 \leq y \leq 1$), $Ir_xTa_y$ ($0 \leq x \leq 1$, $0 \leq y \leq 1$),
$Ir_xZr_y$ ($0 \leq x \leq 1$, $0 \leq y \leq 1$),
$Fe_xW_y$ ($0 \leq x \leq 1$, $0 \leq y \leq 1$),
$W_xSi_y$ ($0 \leq x \leq 1$, $0 \leq y \leq 1$),
$Pt_xSi_y$ ($0 \leq x \leq 1$, $0 \leq y \leq 1$),
$Ta_xSi_yN_z$ ($0 \leq x \leq 1$, $0 \leq y \leq 1$, $0 \leq z \leq 1$),
$Ti_xSi_yN_z$ ($0 \leq x \leq 1$, $0 \leq y \leq 1$, $0 \leq z \leq 1$),
$Mo_xSi_yN_z$ ($0 \leq x \leq 1$, $0 \leq y \leq 1$, $0 \leq z \leq 1$),
$Co_xSi_y$ ($0 \leq x \leq 1$, $0 \leq y \leq 1$),
$Cr_xSi_y$ ($0 \leq x \leq 1$, $0 \leq y \leq 1$),
$Cr_xSi_yN_z$ ($0 \leq x \leq 1$, $0 \leq y \leq 1$),
$Cr_xSi_yO_z$ ($0 \leq x \leq 1$, $0 \leq y \leq 1$, $0 \leq z \leq 1$),
$Ti_xN_y$ ($0 \leq x \leq 1$, $0 \leq y \leq 1$),
$W_xN_y$ ($0 \leq x \leq 1$, $0 \leq y \leq 1$),
$Ti_xW_yN_z$ ($0 \leq x \leq 1$, $0 \leq y \leq 1$, $0 \leq z \leq 1$),
$Hf_xN_y$ ($0 \leq x \leq 1$, $0 \leq y \leq 1$),
$Ta_xN_y$ ($0 \leq x \leq 1$, $0 \leq y \leq 1$),
$Ru_xO_y$ ($0 \leq x \leq 1$, $0 \leq y \leq 1$),
$Mo_xO_y$ ($0 \leq x \leq 1$, $0 \leq y \leq 1$),
$Ir_xO_y$ ($0 \leq x \leq 1$, $0 \leq y \leq 1$) or
$Ni_xCr_yAl_z$ ($0 \leq x \leq 1$, $0 \leq y \leq 1$, $0 \leq z \leq 1$) or combinations of these materials.

A dielectric 5, for example made of $Si_3N_4$,
$Ta_2O_5$,
$SiO_2$,
$Si_xN_yO_z$ ($0 \leq x \leq 1$, $0 \leq y \leq 1$, $0 \leq z \leq 1$),
$SiO_2/Si_3N_4/SiO_2$,
$Ba_{1-x}Sr_xTiO_3$ $SiO_2$
$SrTi_{1-x}Zr_xO_3$ ($0 \leq x \leq 1$) with and without Mn as a dopant,
$BaO-Ln_2O_3-TiO_2$ (Ln=La. Ce, Nd, Sm or Eu),
$Al_2O_3$,
$Ba_2Ti_9O_{20}$,
$Ba_2Ti_{9-x}Zr_xO_{20}$ ($0 \leq x \leq 1$) with and without Mn as a dopant,
$BaTi5O_{11}$,
$BaTi_4O_9$,
$Nb_2O_5$,
$TiO_2$,
$(Ta_2O_5)_x-(Al_2O_3)_{1-x}$ ($0 \leq x \leq 1$),
$(Ta_2O_5)_x-(TiO_2)_{1-x}$ ($0 \leq x \leq 1$),
$(Ta_2O_5)_x-(Nb_2O_5)_{1-x}$ ($0 \leq x \leq 1$),
$(Ta_2O_5)_x-(SiO_2)_{1-x}$ ($0 \leq x \leq 1$),
$(Sr,Ca)(Ti,Zr)O_3$,
$BaO-SrO-CaO-Nd_2O_3-Gd_2O_3-Nb_2O_3-TiO_2$,
$CaSm_2Ti_5O_{14}$,
$Zr(Ti,Sn)O_4$,
$BaO-PbO-Nd_2O_3-Pr_2O_3-Bi_2O_3-TiO_2$,
$Ba(Zr,Zn,Ta)O_3$,
$CaTiO_3-LaAlO_3$,
$(Bi_3(Ni_2Nb)O_9)_{1-x}$ ($0 \leq x \leq 1$),
$(Bi_2(ZnNb_2(_{1+d})_yO_{3+6y+5yd})_x$ ($0 \leq x \leq 1$, $0.5 \leq y \leq 1.5$, $-0.05 \leq d \leq 0.05$)
$Pb(Zr_xTi_{1-x})O_3$ ($0 \leq x \leq 1$) with and without excess lead,
$Pb_{1-\alpha y}La_y(Zr_xTi_{1-x})O_3$ ($0 \leq x \leq 1$, $0 \leq y \leq 0.2$, $1.3 \leq \alpha \leq 1.5$),
$Pb_{1-\alpha y}La_yTiO_3$ ($0 \leq y \leq 0.3$, $1.3 \leq \alpha \leq 1.5$),
$(Pb,Ca)TiO_3$,
$BaTiO_3$ with and without dopants,
$BaZr_xTi_{1-x}O_3$ ($0 \leq x \leq 1$),
$Ba_{1-y}Sr_yZr_xTi_{1-x}O_3$ ($0 \leq x \leq 1$, $0 \leq y \leq 1$),
$Ba(Zn,Ta)O_3$,
$BaZrO_3$,
$PbNb_x((Zr_{0.6}Sn_{0.4})_{1-y}Ti_y))_{1-x}O_3$ ($0 \leq x \leq 0.9$, $0 \leq y \leq 1$),
$Pb(Mg_{1/3}Nb_{2/3})O_3]_x-[PbTiO_3]_{1-x}$ ($0 \leq x \leq 1$) or
$(Pb,Ba,Sr)(Mg_{1/3}Nb_{2/3})_xTi_y(Zn_{1/3}Nb_{2/3})_{1-x-y}O_3$ ($0 \leq x \leq 1$, $0 \leq y \leq 1$, $x+y \leq 1$) or a) $Pb(Mg_{1/2}W_{1/2})O_3$,
b) $Pb(Fe_{1/2}Nb_{1/2})O_3$,
c) $Pb(Fe_{2/3}W_{1/3})O_3$,
d) $Pb(Ni_{1/3}Nb_{2/3})O_3$,
e) $Pb(Zn_{1/3}Nb_{2/3})O_3$,
f) $Pb(Sc_{1/2}Ta_{1/2})O_3$ as well as combinations of the compounds a) to f) with $PbTiO_3$ and $Pb(Mg_{1/3}Nb_{2/3})O_3$ with and without excess lead is provided on said barrier layer 4. On the dielectric 5 there is a further barrier layer 6 which comprises, for example, $Ti_xW_y$ ($0 \leq x \leq 1$, $0 \leq y \leq 1$),
Cr,
$Cr_xO_y$ ($0 \leq x \leq 1$, $0 \leq y \leq 1$),
Nb,
Ta,
Ti,
W,
$Ni_xNb_y$ ($0 \leq x \leq 1$, $0 \leq y \leq 1$),
$Ni_xMo_y$ ($0 \leq x \leq 1$, $0 \leq y \leq 1$),
$Ir_xTa_y$ ($0 \leq x \leq 1$, $0 \leq y \leq 1$),
$Ir_xZr_y$ ($0 \leq x \leq 1$, $0 \leq y \leq 1$),
$Fe_xW_y$ ($0 \leq x \leq 1$, $0 \leq y \leq 1$),
$W_xSi_y$ ($0 \leq x \leq 1$, $0 \leq y \leq 1$),
$Pt_xSi_y$ ($0 \leq x \leq 1$, $0 \leq y \leq 1$),
$Ta_xSi_yN_z$ ($0 \leq x \leq 1$, $0 \leq y \leq 1$, $0 \leq z \leq 1$),
$Ti_xSi_yN_z$ ($0 \leq x \leq 1$, $0 \leq y \leq 1$, $0 \leq z \leq 1$),
$Mo_xSi_yN_z$ ($0 \leq x \leq 1$, $0 \leq y \leq 1$, $0 \leq z \leq 1$),
$Co_xSi_y$ ($0 \leq x \leq 1$, $0 \leq y \leq 1$),
$Cr_xSi_y$ ($0 \leq x \leq 1$, $0 \leq y \leq 1$),
$Cr_xSi_yN_z$ ($0 \leq x \leq 1$, $0 \leq y \leq 1$),
$Cr_xSi_yO_z$ ($0 \leq x \leq 1$, $0 \leq y \leq 1$, $0 \leq z \leq 1$),
$Ti_xN_y$ ($0 \leq x \leq 1$, $0 \leq y \leq 1$),
$W_xN_y$ ($0 \leq x \leq 1$, $0 \leq y \leq 1$),
$Ti_xW_yN_z$ ($0 \leq x \leq 1$, $0 \leq y \leq 1$, $0 \leq z \leq 1$),
$Hf_xN_y$ ($0 \leq x \leq 1$, $0 \leq y \leq 1$),
$Ta_xN_y$ ($0 \leq x \leq 1$, $0 \leq y \leq 1$),
$Ru_xO_y$ ($0 \leq x \leq 1$, $0 \leq y \leq 1$),
$Mo_xO_y$ ($0 \leq x \leq 1$, $0 \leq y \leq 1$),
$Ir_xO_y$ ($0 \leq x \leq 1$, $0 \leq y \leq 1$) or
$Ni_xCr_yAl_z$ ($0 \leq x \leq 1$, $0 \leq y \leq 1$, $0 \leq z \leq 1$) or combinations of these materials.

A second electrode 7 is provided on the barrier layer 6. This second electrode 7 comprises, for example, Al, Al doped with Cu, Al doped with Si, Al doped with Mg or Ag, Cu, Ni, Au, W, or combinations of these metals. A protective layer 8 made from an organic and/or inorganic polymer is provided over this second electrode. The organic polymer used may be, for example, polyimide, and the inorganic polymer, for example, $Si_3N_4$.

Alternatively, at least one first and one second current supply contact may be provided on mutually opposed sides of the passive ceramic component. An electroplated SMD end contact of Cr/Ni, Ni/Sn or Cr/Cu, Cu/Ni/Sn or a Pb/Sn alloy, or a bump end contact, or a via may be used as the current supply contact.

Embodiments which represent possibilities for realizing the invention in practice will now be explained in detail.

Embodiment 1

An adhesion layer 2 of Cr is present on a glass carrier substrate 1. A first electrode 3 of Cu is deposited on this adhesion layer 2. A barrier layer 4 of $Ti_{0.1}W_{0.9}$ is provided on this lower electrode 3. On this barrier layer are disposed a dielectric 5 of $Si_3N_4$ and a further barrier layer 6 of $Ti_{0.1}W_{0.9}$. A second Cu electrode 7 and over this second electrode 7 a protective layer 8 of polyimide are provided on the barrier layer 6.

Embodiment 2

An adhesion layer 2 of Cr is present on a glass carrier substrate 1. A first electrode 3 of Ni is deposited on this adhesion layer 2. A barrier layer 4 of $Ti_{0.1}W_{0.9}$ is provided on this lower electrode 3. On this barrier layer are disposed a dielectric 5 of $SiO_2/Si_3N_4/SiO_2$ and a further barrier layer 6 of $Ti_{0.1}W_{0.9}$. A second Ni electrode 7 and over this second electrode 7 a protective layer 8 of polyimide are provided on the barrier layer 6.

What is claimed is:

1. A passive ceramic component comprising a carrier substrate a first electrode provided on the substrate a second electrode a dielectric layer provided between said first electrode and second electrode and a barrier layer provided between said first electrode and said dielectric layer, characterized in that the barrier layer comprises:

$Ti_xW_y$ ($0 \leq x \leq 1$, $0 \leq y \leq 1$),
Cr,
$Cr_xO_y$ ($0 \leq x \leq 1$, $0 \leq y \leq 1$),
Nb,
Ta,
Ti,
W,
$Ni_xNb_y$ ($0 \leq x \leq 1$, $0 \leq y \leq 1$),
$Ni_xMo_y$ ($0 \leq x \leq 1$, $0 \leq y \leq 1$),
$Ir_xTa_y$ ($0 \leq x \leq 1$, $0 \leq y \leq 1$),
$Ir_xZr_y$ ($0 \leq x \leq 1$, $0 \leq y \leq 1$),
$Fe_xW_y$ ($0 \leq x \leq 1$, $0 \leq y \leq 1$),
$W_xSi_y$ ($0 \leq x \leq 1$, $0 \leq y \leq 1$),
$Pt_xSi_y$ ($0 \leq x \leq 1$, $0 \leq y \leq 1$),
$Ta_xSi_yN_z$ ($0 \leq x \leq 1$, $0 \leq y \leq 1$, $0 \leq z \leq 1$),
$Ti_xSi_yN_z$ ($0 \leq x \leq 1$, $0 \leq y \leq 1$, $0 \leq z \leq 1$),
$Mo_xSi_yN_z$ ($0 \leq x \leq 1$, $0 \leq y \leq 1$, $0 \leq z \leq 1$),
$Co_xSi_y$ ($0 \leq x \leq 1$, $0 \leq y \leq 1$),
$Cr_xSi_y$ ($0 \leq x \leq 1$, $0 \leq y \leq 1$),
$Cr_xSi_yN_z$ ($0 \leq x \leq 1$, $0 \leq y \leq 1$),
$Cr_xSi_yO_z$ ($0 \leq x \leq 1$, $0 \leq y \leq 1$, $0 \leq z \leq 1$),
$Ti_xN_y$ ($0 \leq x \leq 1$, $0 \leq y \leq 1$),
$W_xN_y$ ($0 \leq x \leq 1$, $0 \leq y \leq 1$),
$Ti_xW_yN_z$ ($0 \leq x \leq 1$, $0 \leq y \leq 1$, $0 \leq z \leq 1$),
$Hf_xN_y$ ($0 \leq x \leq 1$, $0 \leq y \leq 1$),
$Ta_xN_y$ ($0 \leq x \leq 1$, $0 \leq y \leq 1$),
$Ru_xO_y$ ($0 \leq x \leq 1$, $0 \leq y \leq 1$),
$Mo_xO_y$ ($0 \leq x \leq 1$, $0 \leq y \leq 1$),
$Ir_xO_y$ ($0 \leq x \leq 1$, $0 \leq y \leq 1$) or
$Ni_xCr_yAl_z$ ($0 \leq x \leq 1$, $0 \leq y \leq 1$, $0 \leq z \leq 1$) and combinations of these materials.

2. A Passive Ceramic Component as claimed in claim 1, characterized in that a further barrier layer is present between the dielectric (5) and the second electrode, which further barrier layer comprises a material selected from the group consisting of $Ti_xW_y$ ($0 \leq x \leq 1$, $0 \leq y \leq 1$),
Cr,
$Cr_xO_y$ ($0 \leq x \leq 1$, $0 \leq y \leq 1$),
Nb,
Ta,
Ti,
W,
$Ni_xNb_y$ ($0 \leq x \leq 1$, $0 \leq y \leq 1$),
$Ni_xMo_y$ ($0 \leq x \leq 1$, $0 \leq y \leq 1$),
$Ir_xTa_y$ ($0 \leq x \leq 1$, $0 \leq y \leq 1$),
$Ir_xZr_y$ ($0 \leq x \leq 1$, $0 \leq y \leq 1$),
$Fe_xW_y$ ($0 \leq x \leq 1$, $0 \leq y \leq 1$),
$W_xSi_y$ ($0 \leq x \leq 1$, $0 \leq y \leq 1$),
$Pt_xSi_y$ ($0 \leq x \leq 1$, $0 \leq y \leq 1$),
$Ta_xSi_yN_z$ ($0 \leq x \leq 1$, $0 \leq y \leq 1$, $0 \leq z \leq 1$),
$Ti_xSi_yN_z$ ($0 \leq x \leq 1$, $0 \leq y \leq 1$, $0 \leq z \leq 1$),
$Mo_xSi_yN_z$ ($0 \leq x \leq 1$, $0 \leq y \leq 1$, $0 \leq z \leq 1$),
$Co_xSi_y$ ($0 \leq x \leq 1$, $0 \leq y \leq 1$),
$Cr_xSi_y$ ($0 \leq x \leq 1$, $0 \leq y \leq 1$),
$Cr_xSi_yN_z$ ($0 \leq x \leq 1$, $0 \leq y \leq 1$),
$Cr_xSi_yO_z$ ($0 \leq x \leq 1$, $0 \leq y \leq 1$, $0 \leq z \leq 1$),
$Ti_xN_y$ ($0 \leq x \leq 1$, $0 \leq y \leq 1$),
$W_xN_y$ ($0 \leq x \leq 1$, $0 \leq y \leq 1$),
$Ti_xW_yN_z$ ($0 \leq x \leq 1$, $0 \leq y \leq 1$, $0 \leq z \leq 1$),
$Hf_xN_y$ ($0 \leq x \leq 1$, $0 \leq y \leq 1$),
$Ta_xN_y$ ($0 \leq x \leq 1$, $0 \leq y \leq 1$),
$Ru_xO_y$ ($0 \leq x \leq 1$, $0 \leq y \leq 1$),
$Mo_xO_y$ ($0 \leq x \leq 1$, $0 \leq y \leq 1$),
$Ir_xO_y$ ($0 \leq x \leq 1$, $0 \leq y \leq 1$) or
$Ni_xCr_yAl_z$ ($0 \leq x \leq 1$, $0 \leq y \leq 1$, $0 \leq z \leq 1$) and combinations of these materials.

3. A passive ceramic component as claimed in claim 1, characterized in that an adhesion layer of Ti, Cr, $Ni_xCr_y$ ($0 \leq x \leq 1$, $0 \leq y \leq 1$), or $Ti_xW_y$ ($0 \leq x \leq 1$, $0 \leq y \leq 1$) is provided between the carrier substrate and the first electrode.

4. A passive ceramic component as claimed in claim 1, characterized in that at least a first and a second current supply contact are provided at mutually opposed sides of the component.

5. A passive ceramic component as claimed in claim 1, characterized in that a ceramic material, a glass-ceramic material, a glass material, or silicon is used for the carrier substrate.

6. A passive ceramic component as claimed in claim 1, characterized in that the electrodes comprise Al, Al doped with Cu, Al doped with Si, Al doped with Mg, or Ag, Cu, Ni, Au, W, or combinations of these metals.

7. A passive ceramic component as claimed in claim 1, characterized in that a protective layer of an organic and/or inorganic polymer is provided on the second electrode.

8. A passive ceramic component as claimed in claim 1, characterized in that the dielectric comprises 1 component selected from the group consisting of:

$Si_3N_4$,
$Ta_2O_5$,
$SiO_2$,
$Si_xN_yO_z$ ($0 \leq x \leq 0 \leq z \leq 1$),
$SiO_2/Si_3N_4/SiO_2$,
$Ba_{1-x}Sr_xTiO_3$ ($0 \leq x \leq 1$,
$SrTi_{1-x}Zr_xO_3$ ($0 \leq x \leq 1$) with and without Mn as a dopant),
$BaO$—$Ln_2O_3$—$TiO_2$ (Ln=La, Ce, Nd, Sm or Eu)
$Al_2O_3$,
$Ba_2Ti_9O_{20}$,
$BaTi_{0-x}Zr_xO_{20}$ ($0 \leq x \leq 1$) with and without Mn as a dopant,
$BaTi_5O_{11}$,
$BaTi_4O_9$,
$Nb_2O_5$,
$TiO_2$,
$(Ta_2O_5)_x$—$(Al_2O_3)_{1-x}$ ($0 \leq x \leq 1$),
$(Ta_2O_5)_x$—$(TiO_2)_{1-x}$ ($0 \leq x \leq 1$),
$(Ta_2O_5)_x$—$(Nb_2O_5)_{1-x}$ ($0 \leq x \leq 1$),
$(Ta_2O_5)_x$—$(SiO_2)_{1-x}$ ($0 \leq x \leq 1$),
$(Sr,Ca)(Ti,Zr)O_3$,
$BaO$—$SrO$—$CaO$—$Nd_2O_3$—$Gd_2O_3$—$Nb_2O_3$—$TiO_2$,
$CaSm_2Ti_5O_{14}$,
$Zr(Ti,Sn)O_4$,
$BaO$—$PbO$—$Nd_2O_3$—$Pr_2O_3$—$Bi_2O_3$—$TiO_2$,
$Ba(Zr,Zn,Ta)O_3$,
$CaTiO_3$—$LaAlO_3$,
$(Bi_3(Ni_2Nb)O_9)_{1-x}$ ($0 \leq x \leq 1$),
$(Bi_2(ZnNb_{2(1+d)y}O_{3+6y+5yd})_x$, ($0 \leq x \leq 1$, $0.5 \leq y \leq 1.5$, $-0.05 \leq d \leq 0.05$)
$Pb(Zr_xTi_{1-x})O_3$ ($0 \leq x \leq 1$) with and without excess lead,
$Pb_{(1-ay)}La_y(Zr_xTi_{1-x})O_3$, ($0 \leq x \leq 1$, $0 \leq y \leq 0.2$, $1.3 \leq a \leq 1.5$
$Pb_{1-ay}La_yTiO_3$ ($0 \leq y \leq 0.3$, $1.3 \leq a \leq 1.5$),
$(Pb,Ca)TiO_3$,
$BaTiO_3$ with and without dopants,
$BaZr_xTi_{1-x}O_3$ ($0 \leq x \leq 1$),
$Ba_{1-y}Sr_yZr_xTi_{1-x}O_3$ ($0 \leq x \leq 1$, $0 \leq y \leq 1$),
$Ba(Zn,Ta)O_3$,
$BaZrO_3$,
$PbNb_x((Zr_{0.6}Sn_{0.4})_{1-y}Ti_y))_{1-x}O_3$ ($0 \leq x \leq 0.9$, $0 \leq y \leq 1$),
$Pb(Mg_{1/3}Nb_{2/3})O_3]_x$—$[PbTiO_3]_{1-x}$ ($0 \leq x \leq 1$),
$(Pb,Ba,Sr)(Mg_{1/3}Nb_{2/3})_xTi_y(Zn_{1/3}Nb_{2/3})_{1-x-y}O_3$ ($0 \leq x \leq 1$, $0 \leq y \leq 1$, $x+y \leq 1$),
a) $Pb(Mg_{1/2}W_{1/2})O_3$,
b) $Pb(Fe_{1/2}Nb_{1/2})O_3$,
c) $Pb(Fe_{2/3}W_{1/3})O_3$,
d) $Pb(Ni_{1/3}Nb_{2/3})O_3$,
e) $Pb(Zn_{1/3}Nb_{2/3})O_3$,
f) $Pb(Sc_{1/2}Ta_{1/2})O_3$ as well as the combinations of the compounds a) to f) with $PbTiO_3$ and $Pb(Mg_{1/3}Nb_{2/3})O_3$ with or without excess lead.

* * * * *